United States Patent [19]

Yui et al.

[11] 4,333,049
[45] Jun. 1, 1982

[54] INRUSH CURRENT MEASURING APPARATUS WITH INSTANTANEOUS POWER INTERRUPTION DEVICE

[75] Inventors: Masatoshi Yui; Minoru Takeoda, both of Tokyo; Kazuo Otsuka, Komoro, all of Japan

[73] Assignee: Takamisawa Cybernetics Co., Ltd., Tokyo, Japan

[21] Appl. No.: 150,128

[22] Filed: May 15, 1980

[30] Foreign Application Priority Data

May 21, 1979 [JP] Japan .............................. 54-66825[U]
May 21, 1979 [JP] Japan .............................. 54-66826[U]
May 21, 1979 [JP] Japan .............................. 54-66827[U]

[51] Int. Cl.³ ..................... G01R 19/00; G01R 27/00; G01R 31/00
[52] U.S. Cl. ................................ 324/102; 324/57 R; 324/121 R; 324/158 R
[58] Field of Search ............... 324/158 R, 102, 103 P, 324/121 R, 57 R; 364/482, 481

[56] References Cited

U.S. PATENT DOCUMENTS

3,101,611 8/1963 Traver ........................... 324/121 R
3,383,589 5/1968 Dugan, Jr. ...................... 324/158 R

*Primary Examiner*—Ernest F. Karlsen
*Attorney, Agent, or Firm*—Jordan and Hamburg

[57] ABSTRACT

Inrush current measuring apparatus with an instantaneous power interruption device is provided an external power input terminal connected to a commercial power supply and an external power output terminal connected to a power unit under test, which terminals are connected together via a switching circuit section; and is equipped with a power interruption device in which the power supply from the external power input terminal to the external power output terminal is cut off or conducted by opening or closing the switching circuit section. By the adoption of a microcomputer serving as a central control circuit, various terminal circuit devices are made centrally controllable and a series of control actions are performed, and the open/close timing for the aforesaid switching circuit section is controlled by the microcomputer under desired set conditions with zero-cross point of commercial line voltage as the selection base, and for observing and displaying the behavior of voltage and current appearing on the external power output terminal side, successively input current value signals are sampled and the current value signals in front and in the rear are compared with each other successively in the order of input, and a peak-held current value signal is displayed by a digital display unit, and when observing the waveform of voltage and current a trigger pulse as a guideline for easier forecast of the observation start point is issued at a zero-cross point of half cycle ahead of the zero-cross point of the commercial line voltage which has been utilized as the selection base for cutoff and conduction timing.

12 Claims, 13 Drawing Figures

INRUSH CURRENT MEASURING APPARATUS WITH INSTANTANEOUS POWER INTERRUPTION DEVICE

This invention relates to an inrush current measuring apparatus with an instantaneous power interruption device capable of instantaneously turning off or on a commercial power supply, etc. and measuring and displaying the state of current flowing in the power feed line at this instant.

Along with the recent widespread of microcomputers, various electronic and electric devices have been improved in performance as reflected in their higher density and higher speed, and they are now ubiquitous. The DC power units used in these devices are mainly of the switching regulator system in view of the merits of savings in size and in weight. In switching regulator type power units, particularly in their performance, the inrush current is large at the instant the power supply is input to work, which in some cases reaches ten-odd to several ten times as large as in the ordinary state, resulting in instantaneous drop in the line voltage and the other devices being affected. Taking pertinent measures against such an inconvenience has heretofore been troublesome and difficult. In addition, the recent aggravation of electric power situation is giving rise to an instantaneous power interruption and other inconveniences also in commercial power supply, and the devices using a commercial power supply are exhibiting unstable phenomena.

For example, an automatic ticket selling machine contains a counter for counting the number of tickets sold for each selling price. To this counter there should be input only required signals, but a malfunction can occur due to noise generated by the automatic selling machine. It has become clear through various experiments that the greatest factor of such a malfunction is the noise generated when the power supply stops instantaneously. Therefore, if the influence of instantaneous power interruption can be made clear, the correctness of data is enhanced.

Heretofore, however, there has been no suitable simulator capable of checking exactly and simply the influence of these phenomena upon devices or the effect of countermeasures applied to the devices. Also in the measurement of inrush current, the measured values vary widely because the timing of power application cannot be controlled, so sampling is made several times and the maximum value is determined as inrush current, and thus much time is required for grasping the exact value. In some conventional instantaneous power interruption devices, moreover, there was difference between the set interruption timing and the actually interrupted instance, influenced for example by a counter electromotive force from the sample.

Also heretofore, for instantaneously stopping a commercial power supply and checking the characteristic thereof, there have been used observation devices, e.g. oscilloscope. Such an observation device as oscilloscope is suitable for measuring iterative waveforms, but is unsuitable for measuring a waveform which is generated only once; that is, for stopping a power supply instantaneously and checking the characteristic thereof, skill has been required.

In power interruption devices of this sort, moreover, a switching circuit section is provided halfway on the line for feeding a commercial power supply to a power unit, and by opening or closing the said switching circuit section, the power supply is turned off or on, in which a high voltage is applied to the external power input terminal to which is connected the commercial power supply, and also to the external power output terminal to which is connected the power unit under test. Thus, since a high voltage is applied to the external power input and output terminals, it is necessary that the work associated with the external input terminal be done after cutting off the commercial power supply completely, and that the work associated with the external power output terminal be performed after completely cutting off the foregoing switching circuit section of the power interruption device. To this end, it is necessary to take some measure so that the workers can be aware that power is fed to the external power input and output terminals. But the measures so far taken for this purpose were not appropriate, which led to unforeseen accidents.

It is a first object of this invention to provide an inrush current measuring apparatus with an instantaneous power interruption device which serves as a simulator capable of checking exactly and simply the influence upon devices of various phenomena occurring at the instant of power interruption and conduction, or the effect of countermeasures applied to the devices.

It is a second object of this invention to provide an inrush current measuring apparatus with an instantaneous power interruption device capable of controlling the timing of power application when measuring an inrush current to devices.

It is a third object of this invention to provide an inrush current measuring apparatus with an instantaneous power interruption device capable of grasping the exact measured value of inrush current.

It is a fourth object of this invention to provide an inrush current measuring apparatus with an instantaneous power interruption device in which the power application timing can be set optionally in the unit of 1 msec. and the inrush current at the worst phase point of device can be determined easily.

It is a fifth object of this invention to provide an inrush current measuring apparatus with an instantaneous power interruption device in which the current measuring range is 0 to 1200 A and the display is made easy to see by the provision of digital readout.

It is a sixth object of this invention to provide an inrush current measuring apparatus with an instantaneous power interruption device capable of hold-displaying the maximum current value.

It is a seventh object of this invention to provide an inrush current measuring apparatus with an instantaneous power interruption device in which, by the adoption of a unique method, a correct power interruption can be made without being affected by counter electromotive force etc. from sample.

It is an eighth object of this invention to provide an inrush current measuring apparatus with an instantaneous power interruption device in which the generation time of instantaneous power interruption can be set optionally in the unit of 1 msec. and the critical operation point in instantaneous power interruption of device can be checked easily.

It is a ninth object of this invention to provide an inrush current measuring apparatus with an instantaneous power interruption device in which the on time and off time of power application can be set independently and which can repeat operation so is employable for the repetition of instantaneous power interruption and in continuous life tests of devices and parts.

It is a tenth object of this invention to provide an inrush current measuring apparatus with an instantaneous power interruption device in which there are provided output voltage and output current monitoring terminals so the output waveform can be observed with an oscilloscope.

It is an eleventh object of this invention to provide an inrush current measuring apparatus with an instantaneous power interruption device in which, for the observation of waveform, a trigger signal is output several msec. ahead of the start of phenomenon, which facilitates the observation with an oscilloscope.

It is a twelfth object of this invention to provide an inrush current measuring apparatus with an instantaneous power interruption device, which has two modes, one being the measurement of inrush current by digital display and the other being instantaneous power interruption.

It is a thirteenth object of this invention to provide an inrush current measuring apparatus with an instantaneous power interruption device in which, while power is fed to external power input and output terminals, this is sure to be displayed so that the workers can be aware of it to thereby prevent them from undergoing electric shock and other possible accidents.

It is a fourteenth object of this invention to provide an inrush current measuring apparatus with an instantaneous power interruption device capable of displaying the maximum current value output from a power unit under test connected to an external power output terminal.

Other objects of this invention will become clear from the description of the specification and drawings, in which:

The apparatus of this invention can perform in a single apparatus the two modes of inrush current measurement by digital display and instantaneous power interruption. In the inrush current mode, the inrush current measuring range is set from 1 to 1200 A, and the power-supply initiating phase angle can be set for each msec. in 1 to 999 msec. from the zero-cross point at 0° or 180° of AC voltage sine wave. On the other hand, in the instantaneous power interruption mode the instantaneous power interruption time can be set at 1 to 999 msec. and 10 to 9990 msec., and instantaneous power interruption can be repeated at intervals of 1 to 99 sec. in addition to manual operation.

In this invention, moreover, a trigger pulse is automatically output to an oscilloscope just before instantaneous interruption of a commercial power supply so that the output waveform can be projected onto the oscilloscope from just before the power interruption, whereby the characteristics of the waveform can be measured without requiring skill.

Figure 1:
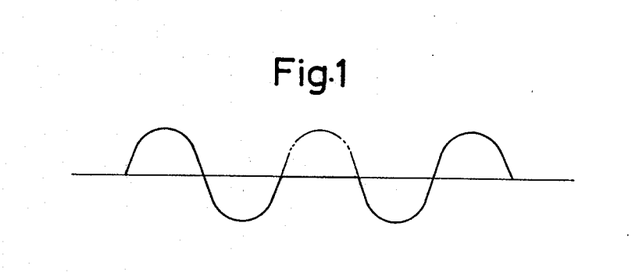
FIGS. 1 and 2 illustrate various cut state in power supply by the inrush current measuring apparatus with an instantaneous power interruption device of this invention.
Figure 2:
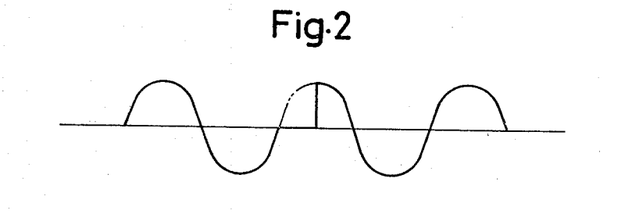

According to this invention, it is possible to cut power supply of about a half cycle (10 msec.) to five cycles (100 msec.) from zero-cross point of a commercial AC 100 V power supply as is shown in FIG. 1, and it is also possible to cut power supply for only a certain time (1 to 10 msec.) within a half cycle from the zero-cross point as is illustrated in FIG. 2. Furthermore, the cut of power supply can be repeated periodically using an interval timer.

In this invention there are provided an external power input terminal connected to a commercial power supply and an external power output terminal connected to a power unit under test, and these input and output terminals are connected together through the medium of a switching circuit section, and by opening or closing the switching circuit section the power supply from the external power input terminal to the external power output terminal is cut off or conducted. The apparatus of this invention is equipped with a power interruption device of such a construction. Furthermore, by the adoption of a microcomputer serving as a central control circuit, various terminal circuit devices are made centrally controllable and a series of control actions are performed; that is, the open/close timing for the aforesaid switching circuit section is controlled by the microcomputer under desired set conditions with zero-cross point of commercial line voltage as the selection base, and for observing and displaying the behavior of voltage and current appearing on the external power output terminal side, successively input current value signals are sampled and the current value signals in front and in the rear are compared with each other successively in the order of input, and a peak-held current value signal is displayed by a digital display unit, and further when observing the waveform of voltage and current a trigger pulse as a guideline for easier forecast of the observation start point is issued at a zero-cross point a half cycle ahead of the zero-cross point of the commercial line voltage which has been utilized as the selection base for cutoff and conduction timing.

In this invention, moreover, a power-supply monitoring pilot lamp as a light emitting device upon power input is provided near the external power input terminal, which pilot lamp displays input of a commercial power supply, and a power-supply monitoring pilot lamp as a light emitting device upon power output is provided near the external power output terminal, which pilot lamp displays output of the power supply, and further provided is a driving circuit which, when a commercial power is fed to the external power input terminal, allows the lamp as a light emitting device upon power input to go on with the power input from the external power input terminal, and allows the lamp as a light emitting device upon power output to go on with the power output from the external power output terminal.

Figure 3:
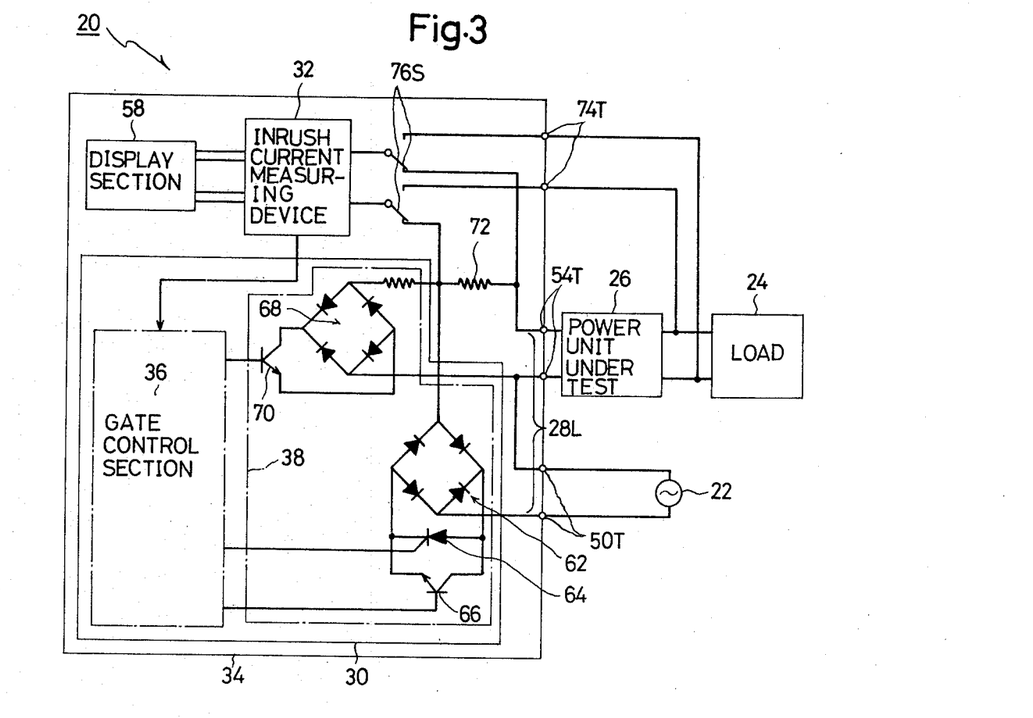
FIG. 3 is a schematic circuit diagram of the inrush current measuring apparatus with an instantaneous power interruption device of this invention.

An embodiment of this invention is described below with reference to FIGS. 3 and 4.

Figure 4:
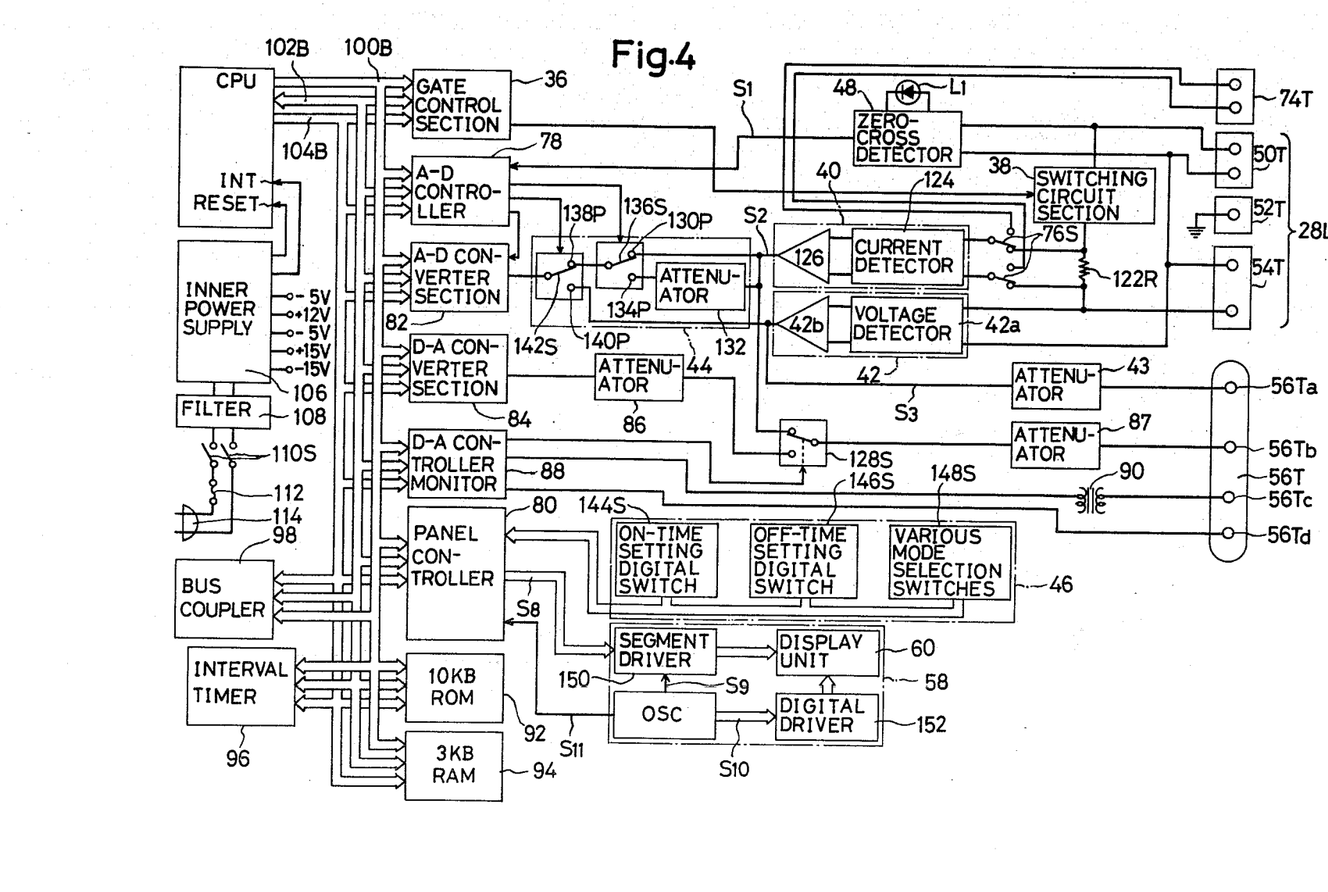
FIG. 4 is a block diagram showing the internal configuration of the inrush current measuring apparatus with an instantaneous power interruption device of this invention.

The inrush current measuring apparatus with an instantaneous power interruption device 20 of this invention comprises an instantaneous power interrupting device 30 which causes instantaneous power interruption by cutting off a line 28L which connects a commercial AC supply 22 to a power unit under test 26 to which is coupled a load 24, and an inrush current measuring device 32 for measuring inrush current etc. developed on the line 28L when energized, the instantaneous power interrupting device 30 and the inrush current measuring device 32 being connected together organically and correlatively and being provided integrally within a single box 34, the former device 30 being provided with a gate control section 36 and a switching circuit section 38, and the latter device 32 being provided with, as illustrated in FIG. 4, a current measuring section 40, a voltage measuring section 42, a change-over circuit section 44, a setting section 46, a zero-cross detector 48, a central control circuit (CPU), and other accessory device circuits. On the front panel of the box 34 there are packaged an external power input terminal 50T for the commercial AC supply 22, an earth terminal 52T, an external power output terminal 54T for the power unit under test 26, a monitor terminal 56T of an oscilloscope (not shown), various switches of the setting section 46, a display unit 60 of a display section 58, etc.

The external power input terminal 50T connecting with the commercial AC supply 22 and the external power output terminal 50T connecting with the power unit under test 26 etc. are coupled together through the medium of a main cutoff circuit 62. The main cutoff circuit 62 conducts by the application of pulse to a thyristor 64 and is cut off by first turning on a transistor 66 to cut off the thyristor 64 and then turning off the transistor 66. The reference numeral 68 is a secondary cutoff circuit for absorbing a counter electromotive force generated from the power unit under test 26 when the main cutoff circuit is brought from its conducting state into a cutoff state, in which the counter electromotive force is absorbed by turning on a transistor 70. The thyristor 64, transistor 66 and transistor 70 of the main and secondary cutoff circuits 62, 68 are controlled by the gate control section 36. The above combined circuitry constitutes the instantaneous power interrupting device 30.

The numeral 72 designates a current detecting resistor, and the inrush current measuring device 32 connected across the resistor 72 measures the potential difference across the said resistor and displays it in terms of a current value in the resistor; that is, analog quantities sampled at every fixed time are converted into digital values and, while comparing with the digital values in front and in the rear, a maximum digital value is stored and displayed in the digital display section 58.

The numeral 74T designates an external input terminal for input of DC which is output from the power unit under test 26 to the load means 24 after rectification of an external current, e.g. the commercial AC supply 22, and the numeral 76S is a change-over switch for connecting the inrush current measuring device 32 to the external input terminal 74 or to the current detecting resistor 72. When the change-over switch 76S is connected to the current detecting resistor 72 side, the maximum value of inrush current on the commercial AC supply 22 side is measured and displayed, while when it is connected to the external input terminal 74 side, the maximum current value output from the power unit under test 26 is displayed. All the above functions are provided within a single box 34, and by the provision of only one unit of the present apparatus 20 there can be executed power application, instantaneous power interruption, and the measurement of characteristics based thereon. Thus the handling and measurement are extremely easy.

A more detailed description is here given with reference to FIG. 4 about the relationship between the constituent device circuits and terminals of the inrush current measuring apparatus with an instantaneous power interruption device 20 of this invention. The switching circuit section 38 which functions to turn on and off the power supply is provided across the line 28L which joins the external power input terminal 50T connecting the commercial AC supply 22 and the external power output terminal 54T connecting the power unit under test 26, and the switching circuit 38 is connected to the central control circuit (CPU) via the gate control section 36 which controls the open/close timing for the switching circuit section 38. To the central control circuit (CPU) is connected via A-D controller 78 the zero-cross detector 48 which detects zero-cross point in sine waveform of the external power input terminal voltage, is also connected via a panel controller 80 the setting section 46 which sets the instantaneous power interruption time in the instantaneous power interruption mode, the power-supply timing in the inrush current mode and the instantaneous power interruption interval in the auto mode on the basis of an analog zero-cross detection signal S1 from the zero-cross detector 48, are further connected via the change-over circuit section 44 and A-D converter section 82 the current detector section 40 and the voltage detector section 42 which detect the current and voltage respectively flowing in the line 28L when the switching circuit section 38 is opened or closed, and is also connected via the panel controller 80 the display section 58 which digitally displays the peak value out of analog current value signals S2 from the current detector section 40. The voltage detector section 42 which output an analog voltage value signals S3 connects via an attenuator 43 to a voltage monitor terminal 56Ta displayably the output of the signals S3. Furthermore, the central control circuit (CPU) is connected to a current monitor terminal 56T via D-A converter section 84 and attenuators 86, 87 and is also connected via D-A controller monitor 88 to a blanking output terminal 56Td and to a trigger output terminal 56Tc which relays a transformer 90, whereby the electrical behavior on the line 28L resulting from the open/close operation of the switching circuit section 38 can be monitored and output as current or voltage information signal S2, S3 of inrush current mode and instantaneous power interruption mode appearing at the external power output terminal 54T.

The central control circuit (CPU) contains a 2KB ROM and a 1KB RAM, to which are further attached for the extension of function a 10KB ROM 92 and a 3KB RAM 94, and the central control circuit (CPU) is coupled through address bus 100B, data bus 102B and control bus 104B to the gate control section 36 as an AC switch controller, the A-D controller 78, A-D converter 82, D-A converter 84, D-A controller monitor 88, panel controller 80, interval timer 96, and bus coupler 98. The numeral 106 is an inner power supply and it is connected to INT and RESET terminals, 108 is a filter, 110S is a power switch, 112 is a fuse and 114 is an attachment plug.

To the zero-cross detector 48 is connected a power-supply monitoring pilot lamp L1 composed of a light emitting diode upon power input which displays whether a voltage is present at the external power input terminal 50T.

Figure 5:
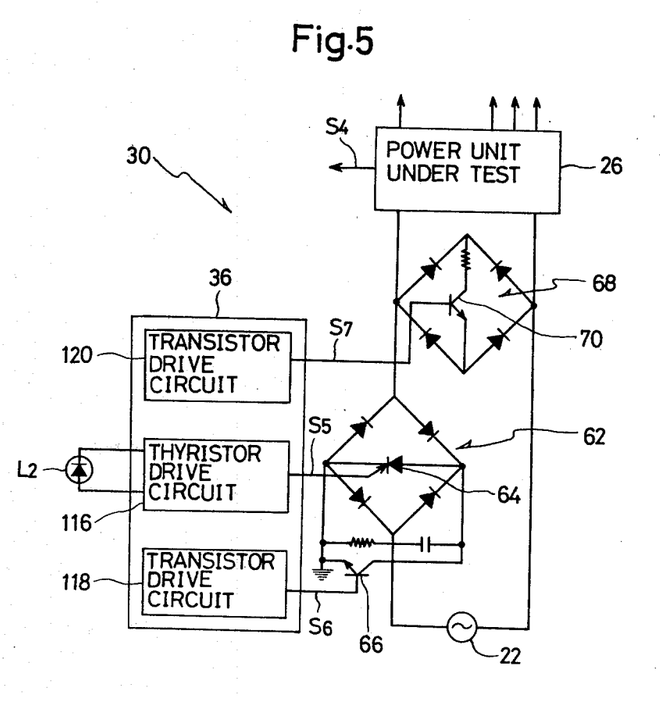
FIGS. 5 and 6 are a schematic internal circuit configuration diagram of an instantaneous power interruption device according to this invention, and a time chart of each part thereof, respectively.
Figure 6:
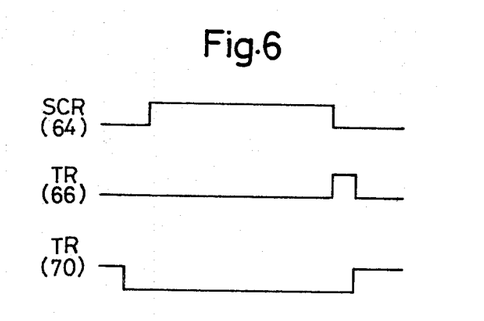

Now the relationship of action between the switching circuit section 38 and the gate control section 36 both constituting the instantaneous power interruption device 30 is described with reference to FIGS. 5 and 6. The numeral 62 is a main cutoff circuit connected to the commercial AC source 22, it is energized by applying a pulse to the thyristor 64 and is cut off by turning on the transistor 66. The numeral 68 is a secondary cutoff circuit connected to the commerical AC supply 22 in the form of a loop with the main cutoff circuit 62, and current is allowed therein by turning on the transistor 70. The numeral 26 is a power unit under test, e.g. an automatic ticket selling machine, and it outputs a power interruption detection signal S4 at time of power interruption. The numeral 36 is a gate control section which controls the gate open/close state for the main and secondary cutoff circuits 62, 68. The gate control section 36 is of a circuit configuration such that when the main cutoff circuit 62 is switched from its conducting state into a cutoff state the secondary cutoff circuit 68 is energized. The numeral 116 is a thyristor drive circuit to which is connected a power-supply monitoring pilot lamp L2 composed of a light emitting diode upon power output which displays whether a voltage is present at the external power output terminal 54T, the numeral 118 is a transistor drive circuit for the main cutoff circuit 62, and 120 is a transistor drive circuit for the secondary cutoff circuit 68. FIG. 6 is a time chart showing the state of operation of each part in response to drive timing signals S5, S6, S7 which are output from these circuits. On the basis of the said time chart, the state of power interruption is here explained. When the main cutoff circuit 62 is held at cutoff, that is, when the thyristor 64 and the transistor 66 are held off, the power supply from the commercial AC supply 22 to the power unit under test 26 is cut off, and by the drive timing signal S7 which is output from the transistor drive circuit 120 the transistor 70 is turned on to cause the secondary cutoff circuit 68 to be completed. For providing the commercial AC supply 22 to the power unit under test 26, the drive timing signal S7 output from the transistor drive circuit 120 is stopped in advance to turn off the transistor 70 thereby breaking the secondary cutoff circuit 68. Thereafter, a pulse is applied from the thyristor drive circuit 68 to the thyristor 64 to bring the main cutoff circuit 62 into conducting state, whereby the commercial AC supply 22 is provided to the power unit under test 26, so that the power unit under test 26 outputs at a predetermined voltage level.

The following description is now provided about the case where from the state just mentioned above the commercial AC supply 22 fed to the power unit under test 26 is cut off. First the drive timing signal S6 is output from the transistor drive circuit 118 to turn on the transistor 66, and the current in the thyristor 64 is returned to the transistor 66 to turn off the thyristor 64. At this time, the main cutoff circuit 62 is not cut off because there is current flow in the transistor 66. When the thyristor 64 is completely turned off, the drive timing signal S6 output from the transistor drive circuit 118 is stopped to turn off the transistor 66 thereby breaking the main cutoff circuit 62 completely, whereupon the drive timing signal S7 is output from the transistor drive circuit 120 to turn on the transistor 70 and the secondary cutoff circuit 68 is brought into conducting state, so that, when the main cutoff circuit 62 is held at cutoff, a counter electromotive force from the power unit under test 26 flows through the secondary cutoff circuit 68. Consequently, the counter electromotive force does not act on the power unit under test 26 and hence the AC voltage waveform in instantaneous power interruption is not disordered, and simultaneously with the power cutoff by the main cutoff circuit 62 the power unit under test 26 assumes an instantaneous power interruption state. All these operations are controlled by the gate control section 36, and the counter electromotive force generated from the power unit under test 26 when cutting off the commercial AC supply 22 is recycled, whereby it is made possible to eliminate the action of such counter electromotive force and to prevent the occurrence of various troubles at time of power interruption.

The current detector section 40 includes a current detector 124 which detects analog current value signals S2 successively and an amplifier 126 which amplifies the analog current value signals S2, both being connected across a current detecting resistor 122R which is connected in series with the output side of the line 28L, and the current detector section 40 can be switched so as to connect with a current monitor terminal 56Tb by means of a monitor change-over switch 128S which is interposed between the attenuators 86 and 87.

The voltage detector 42 includes a voltage detector 42a which detects successively the analog voltage value signals S3 to be impressed among the line 28L and an amplifier 42b which amplifies the analog voltage value signals S3.

The change-over circuit section 44 includes an automatic range change-over switch 136S and a power operation change-over switch 142S, the range change-over switch 136S having a selection contact 130P which receives the analog current value signal S2 as it is from the current detector section 40 and also having a selection contact 134P which connects with an attenuator 132 adapted to attenuate the analog current value signal S2 into a one-tenth value, the selection contacts 130P and 134P being disposed side by side, and the power operation change-over switch 142S having a selection contact 138P which connects with the range change-over switch 136S and also having a selection contact 140P which connects with the voltage detector section 42, the selection contacts 138P and 140P being disposed side by side, whereby either the analog current value signal S2 or the analog voltage value signal S3 is switched to conduction.

The setting section 46 includes an on-time setting digital switch 144S, an off-time setting digital switch 146S and various mode selection switches 148S. In the display section 58, a peak digital current value signal S8 transmitted through the panel controller 80 after comparison in the central control circuit (CPU) is received by a segment driver 150 and, with the reception of a driving pulse signal S9 from a pulse oscillator (OSC) as a sign and in synchronism and cooperation with a digital driver 152 which has simultaneously received a driving pulse signal S10, the digital current value signal S8 is displayed in 4 digits on the display unit 60 which is composed of a 7-segment light emitting diode, while the pulse oscillator (OSC) transmits a pulse signal S11 to the central control circuit (CPU) via the panel controller 80.

Figure 7:
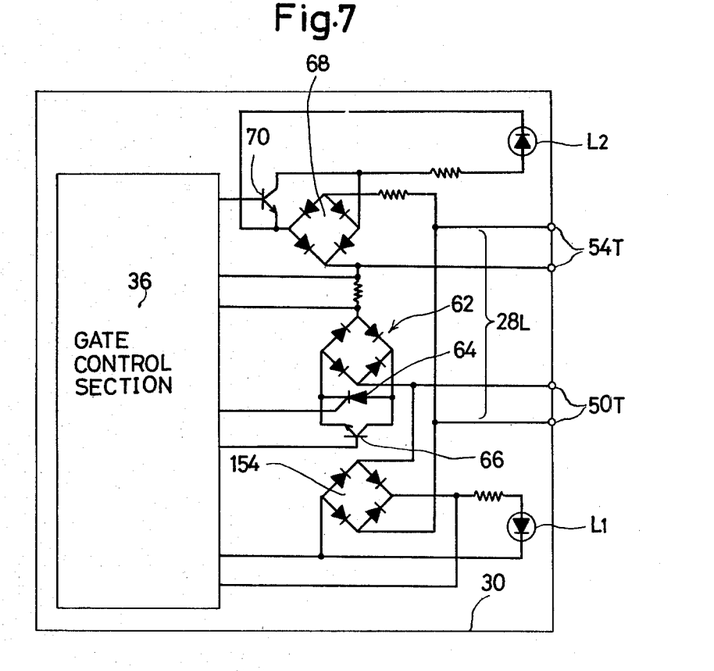
FIG. 7 is a schematic internal circuit configuration diagram showing another embodiment of an instantaneous power interruption device according to this invention provided with power-supply monitoring pilot lamps.

Another embodiment is here described with reference to FIG. 7 in which the power-supply monitoring pilot lampls L1, L2 are attached to the switching circuit section 38 in place of the zero-cross detector 48 and the thyristor drive circuit 116. The numeral 50T is an external power input terminal for connection with a commercial AC supply, and 54T is an external power output terminal for connection with the power unit under test 26 of the load 24. Mounted above the external power input terminal 50T is the power-supply monitoring pilot lamp L1 composed of a light emitting diode upon power input which goes on when the commercial AC supply 22 is fed to the external power input terminal 50T, while mounted above the external power output terminal 54T is the power-supply monitoring pilot lamp L2 formed of a light emitting diode upon power output which goes on when the commercial AC supply 22 is output from the external power output terminal 54T. The numeral 62 is a main cutoff circuit mounted on line 28L which connects from the extenal power input terminal 50T to the external power output terminal 54T, the main cutoff circuit 62 being adapted to conduct when pulse is applied to the thyristor 64 and to be cut off by turning off the transistor 66 after turning on the transistor 66 to cut off the thyristor 64. The numeral 154 is a rectifier circuit which rectifies the input current from the external power input terminal 50T and provides it to the gate control section 36, to which rectifier circuit 154 is connected the power-supply monitoring pilot lamp L1. The numeral 68 is a secondary cutoff circuit for absorbing a counter electromotive force generated when the main cutoff circuit 62 is switched from its conducting state into a cutoff state, to which secondary cutoff circuit 68 is connected the power-supply monitoring pilot lamp L2. When the main cutoff circuit 62 is cut off, the transistor 70 is turned on to cause the secondary cutoff circuit 68 to conduct, which absorbs the counter electromotive force. The secondary cutoff circuit 68 and the rectifier circuit 154 constitute a driving circuit for the power-supply monitoring pilot lamps L1, L2. The open/close timing of the main and secondary cutoff circuits 62, 68 is controlled by a signal which is output from the gate control section 36. Thus, the power-supply monitoring pilot lamp L1 is directly connected to the external power input terminal 50T via the rectifier circuit 154, and the power-supply monitoring pilot lamp L2 directly to the external power output terminal 54T via the secondary cutoff circuit 68 (having a rectifying function), so that the lamps L1 and L2 are sure to light when power is fed to the terminals 50T and 54T.

According to this embodiment, as described above, the pilot lamps are connected to the input and output terminals of the instantaneous power interruption device 30 so that they are lit by the power supply at the input and output terinals, therefore electric shock and other accidents can be prevented.

Figure 8:
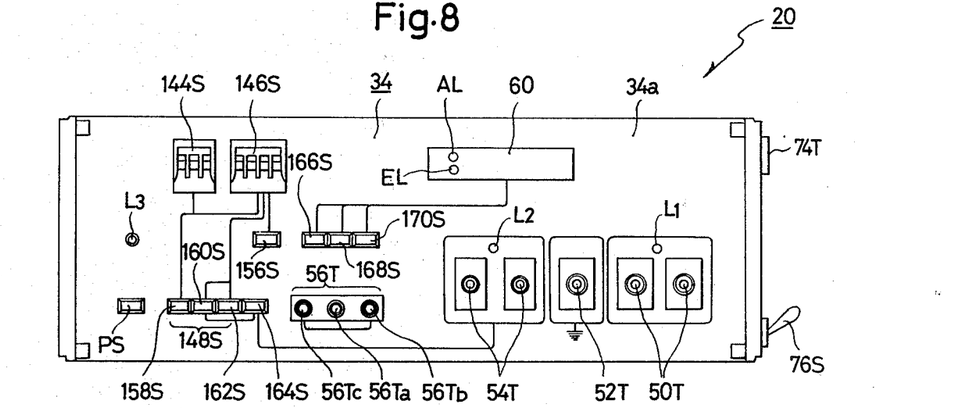
FIG. 8 is a front view of a box-like front panel which packages various switches, terminals and display units.

Now the switches, terminals and display units packaged on the front panel 34a of the box 34 are here described with reference to FIG. 8 in connection with FIG. 4.

The reference mark (PS) is a power push-button switch for turning on and off the inner power supply 106; L3 is a power display lamp formed of a light emitting diode upon power input which lights when the power push-button switch (PS) is turned on; 144S is a 2-digit on time setting digital switch for setting the instantaneous power interruption interval in the auto mode and it can set from 1 to 99 sec. (in the unit of 1 sec.); 146S is a 3-digit off time setting digital switch for setting the power application timing (phase) in the inrush current mode and it can set from 1 to 999 msec. (in the unit of 1 msec.) and from 10 to 9990 msec. (in the unit of 10 msec.); 156S is an off time magnification push-button switch which can switch between 1 to 999 msec. (in the unit of 1 msec.) in its largely projected state and 10 to 9990 msec. (in the unit of 10 msec.) in its slightly projected state; 158S is an auto mode push-button switch for controlling the interval timer 96 so that an instantaneous power interruption is repeated only for a preset time with a preset period; 160S is an inrush current mode push-button switch for sampling inrush currents in the power unit 26 under test in synchronism with off time and displaying the maximum value digitally; 162S is a manual instantaneous power interruption mode push-button switch which when depressed causes one instantaneous power interruption only for a preset time; 164S is a line push-button switch for providing the power on the external power input terminal 50T to the external power output terminal 54T, the line switch 164S making the generation of inrush current and instantaneous power interruption possible in combination with the auto mode switch 158S, inrush current mode switch 160S or manual instantaneous power interruption mode switch 162S; 166S is a push-button switch for continuously sampling line current values and displaying the maximum value digitally; 168S is a push-button switch for sampling for a period of 100 msec. from the start of power supply, repeating a 100 msec. sampling at intervals of 0.5 sec. while the power supply is continued and displaying the maximum current value in the sampling digitally; 170S is a push-button switch for sampling while it is depressed and displaying the maximum current value during that period digitally; 60 is a digital current indicator provided with a 4-digit 7-segment light emitting diode (LED) for displaying the maximum current value (peak value) and having an auto 2-range function of 1 to 254 A: 1 A unit and 255 to 1200 A: 10 A unit; (AL) is a warning lamp which burns out a protective fuse contained in the present apparatus 20 and lights when the supply current exceeds the maximum value of 1200 A; (EL) is an error lamp which lights as an error indication when two or more of auto mode switch 158S, inrush current mode switch 160S and manual instantaneous power interruption mode switch 162S are depressed, when the off time is set at zero in the auto mode or instantaneous power interruption mode and when the on time is set at zero in the auto mode, the error lamp (EL) being adapted to reset automatically in normal state; L2 is a power-supply monitoring pilot lamp which monitors whether a voltage is present at the external power output terminal and which lights when power is fed; L1 is a power-supply monitoring pilot lamp which monitors whether a voltage is present at the external power input terminal 50T and which lights when power is fed; 54T is an external power output terminal for connection with the power unit under test 26; 52T is an earth terminal; 50T is an external power input terminal for connection with the commercial AC supply 22; 56T is a monitor terminal for oscilloscope including three output terminals for observing current and voltage waveforms, which are a trigger output terminal 56Tc, a voltage monitor terminal 56Ta and a current monitor terminal 56Tb, the three output terminals having the following specifications.

|  | Output Level | Output Impedance | Pulse Width |
|---|---|---|---|
| 56Tc | DC 2.5 V | 70 Ω | 200 μ |
| 56Ta | 10 mV/V (rms value) | 1 kΩ |  |
| 56Tb | 10 mV/V (rms value) | 1 kΩ |  |

In the measurement of current with the apparatus of this invention constructed as above, analog current value signal S2 produced in the current detecting resistor 122R which is inserted on the output side of the line 28L is digitized by the A-D converter 82 via the change-over circuit section 44 and is taken in and processed by the central control circuit (CPU). The processing interval in the A-D converter 82 is 200 μsec., the frequency of the power supply 106 for the central control circuit is 50 to 60 Hz, and the number of sampling on half wave is 50 at 50 Hz and 40 at 60 Hz, but this is sufficient as a resolution in inrush current measurement. In the measurement of peak current, if data taken in the central control circuit (CPU) at every fixed time is larger than the existing data, rewriting of data is made. This operation is repeated until the set time is reached, and the peak current is displayed in 4 digits on the display unit 60 of the display section 58 via the panel controller 80.

For instantaneous power interruption, the thrysitor 64, (SCR) contained in the switching circuit section 38 is used to open and close the line 28L output and, with the zero-cross point of voltage from the zero-cross point detector 48 as a starting point, the central control circuit (CPU) performs an arithmetic operation and transmits a control signal to the gate control section 36 allowing the latter to provide drive timing signals S5, S6, S7 to the switching circuit section 38.

The on time can be set at 1 to 99 sec. at intervals of 1 sec. by the on time setting digital switch 144S, while the off time can be set at 1 to 990 msec. at intervals of 1 msec. by the off time setting digital switch 146S and further can be set in the range of 10 to 9990 msec. at intervals of 10 msec. using a 10-fold range by the magnification switch 156S.

Now the method of operation of this invention is here described.

Figure 9:
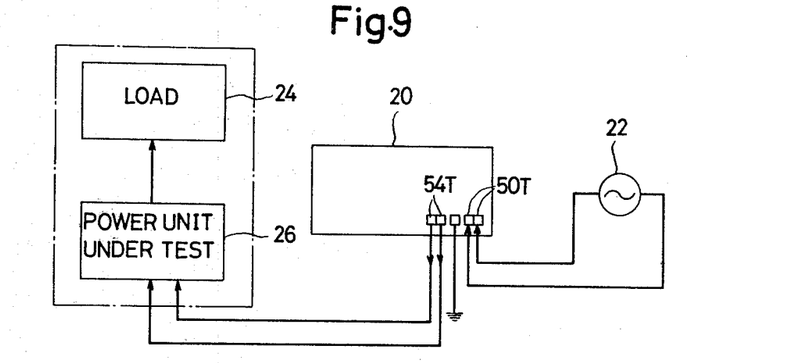
FIG. 9 is a connection diagram among the present apparatus, a commercial AC supply and a load-coupled power unit under test, in the inrush current mode operation.

A. Inrush Current Mode Operation
*Operation Procedure
(a) Connect the commercial AC supply 22 to the external power input terminal 50T of the present apparatus 20, and connect the inrush current measuring power unit 26 or other load 24 to the external power output terminal 54T, in such a manner as illustrated in FIG. 9.
(b) With the off time setting digital switch 146S, set the power-supply start timing for the external power output terminal 54T.
(c) Depress the push-button switch 166S of the digital current indicator 60.
(d) Depress the inrush current mode switch 160S.
(e) Depress the line switch 164S to start power supply at the timing shown in FIG. 10, with inrush current diplayed on the digital current indicator 60.

Figure 10:
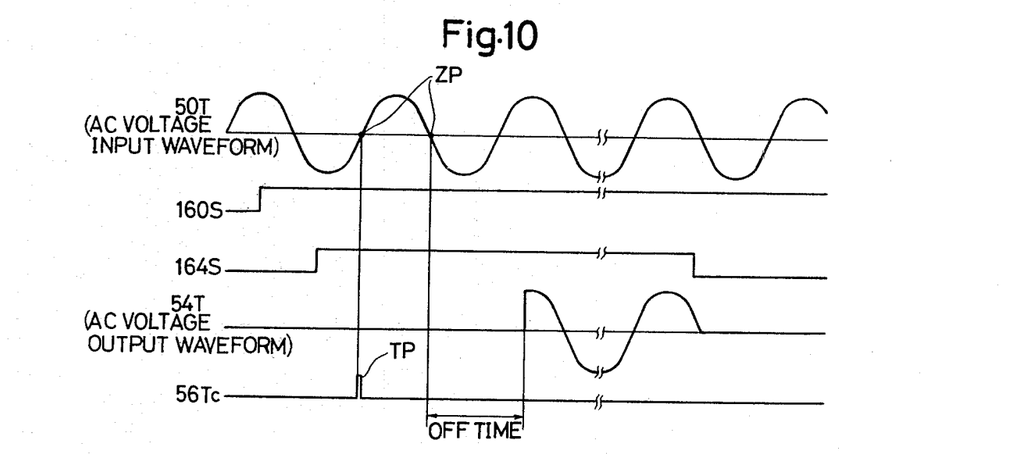
FIG. 10 is a time chart of the inrush current mode.

Explanation of the time chart of FIG. 10—After the line switch 164S was turned on, a trigger pulse (TP) is generated at the first zero-cross point (ZP) and, after the lapse of the preset off time from the next zero-cross point, the external power output terminal 54T is energized.

B. Instantaneous Power Interruption Mode Operation

Figure 11:
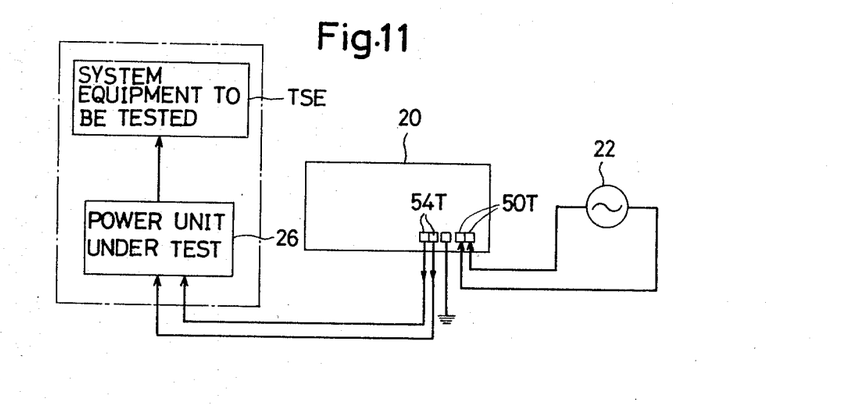
FIG. 11 is a connection diagram among the present apparatus, a commercial AC supply and a power unit under test to which is coupled a system equipment to be tested, in the instantaneous power interruption mode.

B1. Manual Operation for Instantaneous Power Interruption
*Operation Procedure
(a) Connect the commercial AC supply 22 to the external power input terminal 50T of the present apparatus 20, and connect the system equipment to be tested (TSE) including the power unit 26 to the external power output terminal 54T, in such a manner as illustrated in FIG. 11.
(b) Set the instantaneous power interruption time with the off time setting digital switch 146S and magnification switch 156S.
(c) Depress the line switch 164S.
(d) Depress the manual instantaneous power interruption mode switch 162S to produce an instantaneous power interruption as shown in the time chart of FIG. 12.

Figure 12:
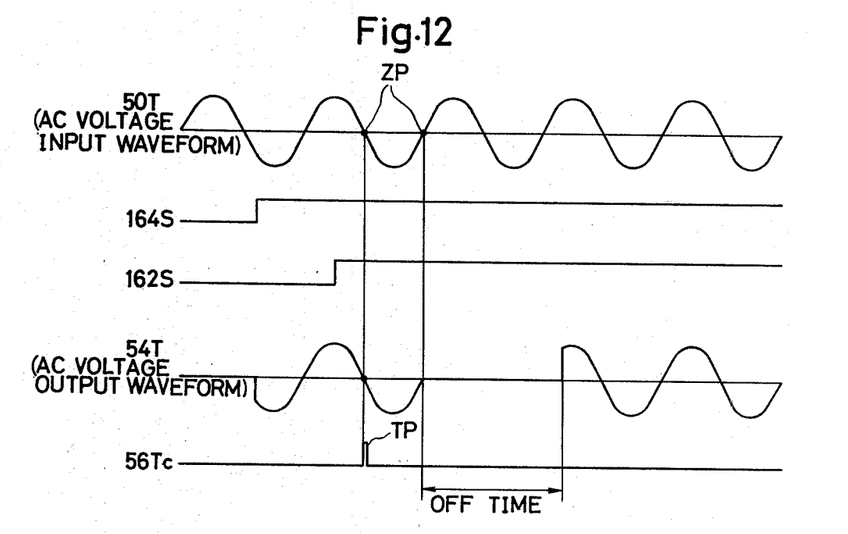
FIG. 12 is a time chart of manual instantaneous power interruption mode.

Explanation of the time chart of FIG. 12:
(1) The line switch 164S is turned on to energize the external power output terminal 54T.
(2) The manual instantaneous power interruption mode switch 162S is turned on to allow a trigger pulse (TP) to be generated at the first zero-cross point (ZP) and an instantaneous power interruption is started from the next zero-cross point (ZP), which is continued by the preset off time.

B2. Automatic Operation for Instantaneous Power Interruption
*Operation Procedure
(a) Connect the commerical AC supply 22 to the external power input terminal 50T of the present apparatus 20, and connect the system equipment to be tested (TSE) including the power unit 26 to the external power output terminal 54T.
(b) Set the instantaneous power interruption time with the off time setting digital switch 146S and magnification switch 156S.
(c) Set the power-supply time with the on time setting digital switch 144S.
(d) Depress the line switch 164S.
(e) Depress the auto switch 158S to generate such a repeated instantaneous power interruption as shown in the time chart of FIG. 12.

Figure 13:
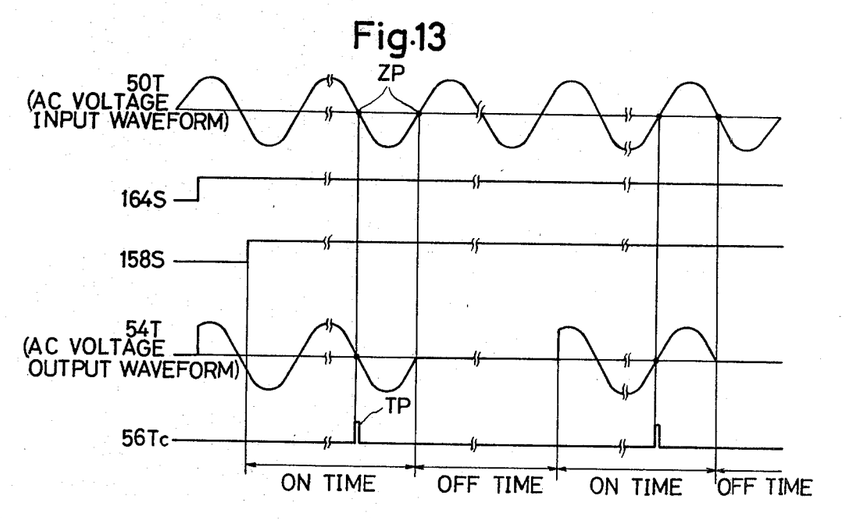
FIG. 13 is a time chart of automatic instantaneous power interruption mode.

Explanation of the time chart of FIG. 13:
(1) The line switch 164S is turned on to energize the external power output terminal 54T.
(2) The auto switch 158S is turned on to allow power to be fed continuously only for the preset on time, thereafter an instantaneous power interruption is repeated according the preset off and on time.

What we claim is:

1. An inrush current measuring apparatus with an instantaneous power interruption device, comprising an external power input terminal means connecting with a commercial AC supply means, an external power output terminal means connecting with a power unit to be tested, a switching circuit section means functioning to turn on and off the power supply, said switching circuit section means being disposed across a line which connects said external power input terminal means with said external power output terminal means, a gate control section means which controls the open/close timing for said switching circuit section means, a central control circuit means connected via said gate control section means to said switching circuit section, a zero-cross detector section means for detecting zero-cross point in sine waveform of voltage at said external power input terminal means, said zero-cross detector section means being connected to said central control circuit means, a setting section means for setting, on the basis of a zero-cross detection signal from said zero-cross detector section means, an instantaneous power interruption time in instantaneous power interruption mode and a power supply timing in inrush current mode and further an instantaneous power interruption interval in auto mode, said setting section means being connected to said central control circuit means, a current detector section means and a voltage detector section means which detect the current and voltage respectively flowing in said line when said switching circuit section means is opened or closed, both said current detector section means and said voltage detector section means being connected to said central control circuit means, and further a display section means which displays a peak value out of current value signals from said current detector section means, said central control circuit means being further connected to a current monitor terminal means and to a trigger output terminal means, whereby the electrical behavior on said line resulting from the open/close operation of said switching circuit means can be monitored and output as current or voltage information signals of inrush current mode and instantaneous power interruption mode appearing at said external power output terminal means.

2. The inrush current measuring apparatus with an instantaneous power interruption device as defined in claim 1, in which said zero-cross detector section means connects with a power-supply monitoring pilot lamp means which displays by lighting the presence of voltage at said external power input terminal means.

3. The inrush current measuring apparatus with an instantaneous power interruption device as defined in claim 1, in which said switching circuit section means includes a main cutoff circuit means formed of a switching element means such as a thyristor means and a secondary cutoff circuit means formed of a switching element means connected to said main cutoff circuit means in the form of a loop with respect to the commercial AC supply means connected to said external power input terminal means, said main and secondary cutoff circuit means being connected to said gate control section means so that said secondary cutoff circuit means is energized when said main cutoff circuit means is switched from conducting state into cutoff state, thereby allowing a counter electromotive force from the power unit under test etc. caused by the breaking of said main cutoff circuit means to be absorbed by said secondary cutoff circuit means.

4. The inrush current measuring apparatus with an instantaneous power interruption device as defined in claim 3, in which to said secondary cutoff circuit means of said switching circuit section means is connected a power-supply monitoring pilot lamp means which displays an input of the power unit under test to said external power output terminal means, and to said external power output terminal means is connected a power-supply monitoring pilot lamp means via a rectifier circuit means.

5. The inrush current measuring apparatus with an instantaneous power interruption device as defined in claim 1, in which said gate control section means is composed of a thyristor driving circuit means which receives a control signal from said central control circuit means and provides a drive timing signal to a thyristor means in said main cutoff circuit means of said switching circuit section means, a transistor driving circuit means which provides a drive timing signal to a transistor means in said main cutoff circuit means, and a transistor driving circuit means which provides a drive timing signal to a transistor means in said secondary cutoff circuit means of said switching circuit section means.

6. The inrush current measuring apparatus with an instantaneous power interruption device as defined in claim 1, in which said central control circuit means is connected to said zero-cross detector section means via an A-D controller means, is connected to said setting section means and said display section means via a panel controller means, is connected to said current detector section means and said voltage detector section means via on A-D converter section means and then a change-over circuit section means, is connected to said current monitor terminal means via a D-A converter section means and then an attenuator means, and is connected to said trigger output terminal means via a D-A controller monitor means.

7. The inrush current measuring apparatus with an instantaneous power interruption device as defined in claim 1, in which said current detector section means includes a current detector means for detecting current value signals successively connected across a current detecting resistor means which is inserted in series with the output side of said line, and an amplifier means for amplifying said current value signals.

8. The inrush current measuring apparatus with an instantaneous power interruption device as defined in claim 1, in which said current detector section means can be switched into connection with said current monitor terminal means by a monitor change-over switch means which is inserted between a D-A converter means and said current monitor terminals means.

9. The inrush current measuring apparatus with an instantaneous power interruption device as defined in claim 1, in which said voltage detector section means is connected to a voltage monitor terminal means via an attenuator means.

10. The inrush current measuring apparatus with an instantaneous power interruption device as defined in claim 6, in which there is provided the change-over circuit section means which includes an automatic range change-over switch means and a power operation change-over switch means, said range change-over switch means having a selection contact means which receives current value signals as they are from said current detector section means and further having a selection contact means connecting with an attenuator means which attenuates said current value signals, both said selection contact means being disposed side by side, said power operation change-over switch means having a selection contact means which connects with said range change-over switch means and further having a selection contact means which connects with said voltage detector section means, whereby either a current value signal or a voltage value signal is allowed to pass switchably, both said selection contact means being disposed side by side.

11. The inrush current measuring apparatus with an instantaneous power interruption device as defined in claim 1, in which said gate control section means and said switching circuit section means are included in the instantaneous power interruption device which generates an instantaneous power interruption by cutting off said line connecting the commercial AC supply means with the power unit under test, said instantaneous power interruption device being contained in a box means.

12. The inrush current measuring apparatus with an instantaneous power interruption device as defined in claim 6, in which said current detector section means, said voltage detector section means, the change-over circuit section means, said setting section means, said zero-cross detector section means and said central control circuit means are included in the inrush current measuring apparatus means which measures an inrush current etc. generated on said line connecting the commercial AC supply means with the power unit under test when said line is energized, said inrush current measuring apparatus means being contained in a box means.

* * * * *